(12) United States Patent
Elliott

(10) Patent No.: US 7,110,558 B1
(45) Date of Patent: Sep. 19, 2006

(54) SYSTEMS AND METHODS FOR AUTOMATICALLY ADJUSTING THE VOLUME OF AN AUDIO SOURCE

(75) Inventor: Brig Barnum Elliott, Arlington, MA (US)

(73) Assignees: Verizon Corporate Services Group Inc., New York, NY (US); BBN Technologies Corp., Cambridge, MA (US)

( * ) Notice: Subject to any disclaimer, the term of this patent is extended or adjusted under 35 U.S.C. 154(b) by 1048 days.

(21) Appl. No.: 09/699,922

(22) Filed: Oct. 30, 2000

(51) Int. Cl.
*H03G 3/00* (2006.01)

(52) U.S. Cl. .................. 381/105; 381/104; 381/107; 381/56

(58) Field of Classification Search .............. 381/105, 381/107, 104, 109, 56, 102, 108; 700/94; 348/14.05
See application file for complete search history.

(56) References Cited

U.S. PATENT DOCUMENTS

| | | | |
|---|---|---|---|
| 4,553,257 A | 11/1985 | Mori et al. | 381/57 |
| 4,628,530 A * | 12/1986 | Op De Beek et al. | 381/103 |
| 5,027,432 A | 6/1991 | Skala et al. | 455/238 |
| 5,369,711 A * | 11/1994 | Williamson, III | 381/104 |
| 5,386,478 A * | 1/1995 | Plunkett | 381/103 |
| 5,615,256 A * | 3/1997 | Yamashita | 379/390.01 |
| 5,647,011 A | 7/1997 | Garvis | 381/123 |
| 5,668,884 A | 9/1997 | Clair et al. | 381/82 |
| 5,675,390 A | 10/1997 | Schindler et al. | 348/552 |
| 5,778,077 A * | 7/1998 | Davidson | 381/57 |
| 6,006,115 A | 12/1999 | Wingate | 455/568 |
| 6,061,455 A * | 5/2000 | Hadley et al. | 381/57 |
| 6,169,807 B1 * | 1/2001 | Sansur | 381/57 |
| 6,584,201 B1 * | 6/2003 | Konstantinou et al. | 381/57 |

* cited by examiner

*Primary Examiner*—Vivian Chin
*Assistant Examiner*—Justin Michalski

(57) ABSTRACT

A system adjusts audio levels so as to maintain a constant perceived audio level at a user's location. The system includes a sensor (110) and an audio device (120). The sensor (110) receives a first audio signal, receives at least one data packet (1000) comprising a second audio signal, determines whether a difference between an average volume level of the first audio signal and the second audio signal exceeds a threshold value, generates a response data packet (1200) including a volume adjustment command when the difference between the average volume level of the first audio signal and the second audio signal exceeds the threshold value, and transmits the response data packet (1200). An audio device (120) transmits the first audio signal, transmits the at least one data packet (1000) to the sensor (110), receives the response data packet (1200), and adjusts an audio level based on the response data packet (1200).

21 Claims, 18 Drawing Sheets

LOCAL SENSOR 110

LOCAL SENSOR 110

SYSTEMS AND METHODS FOR AUTOMATICALLY ADJUSTING THE VOLUME OF AN AUDIO SOURCE

FIELD OF THE INVENTION

The present invention relates generally to a radio receiving apparatus and, more particularly, to a system and method for automatically adjusting the volume of an audio source.

BACKGROUND OF THE INVENTION

Listening to radio and television broadcasts, whether they are music, news, or discussion-based programming, consumes a large amount of time of the average individual. As people's lives become busier, there is more of a tendency for multi-tasking. It is quite common for an individual to perform one or more tasks while watching television or listening to the radio. These tasks may involve the individual moving from one location to another (e.g., from the living room to the kitchen). As a result, the individual may be forced to constantly adjust the audio level of the radio or television in order to maintain a comfortable listening level.

For example, suppose that a person is listening to a radio or stereo that is playing from a fixed location, such as the living room. As the listener moves throughout the house, the perceived volume at the listener's location does not remain constant but varies based on the listener's distance from the audio source. It would be impractical to constantly go back to the radio or stereo system to manually adjust the volume to retain a relatively constant volume as perceived by the listener as he or she moves throughout the house.

As another example, suppose that an automobile driver is listening to the car radio while driving. The noise level inside the car is constantly changing. For example, most drivers find that they have to adjust the volume of the radio to different levels as the car changes from highway to city driving speeds. As a result, the automobile radio listener is repeatedly required to manually adjust the volume of the radio to keep it at a perceived constant volume.

Suppose, as a further example, that a telephone with hands-free speaker operation is being used by a consumer in the kitchen of a house. As the consumer moves away from the telephone and moves about the kitchen, it may become difficult to hear the caller out of the telephone's speaker due to either the distance from the telephone or the noise in the kitchen, or both.

Accordingly, there is a need in the art for a system and method that will allow the perceived volume of an audio source to remain at a constant level irrespective of a listener's location.

SUMMARY OF THE INVENTION

Systems and methods consistent with the present invention address this and other needs by providing a mechanism through which an audio source and an associated local sensor can maintain a constant perceived volume level for a user in close proximity to the local sensor.

In accordance with the purpose of this invention as embodied and broadly described herein, a method adjusts an audio level of an audio device. The method includes receiving a first audio signal from the audio device; receiving a data packet from the audio device, the data packet comprising a second audio signal; determining whether a difference between the first audio signal and the second audio signal exceeds a threshold value; and adjusting the audio level of the audio device when the difference between the first audio signal and the second audio signal exceeds the threshold value.

In another implementation consistent with the present invention, a system for adjusting an audio level includes a sensor and an audio device. The sensor receives at least one first audio signal, generates a data packet, the data packet comprising the at least one first audio signal, and transmits the data packet. The audio device receives the data packet, retrieves at least one second audio signal, determines average volume levels of the at least one first audio signal and the at least one second audio signal, multiplies the average volume level of the at least one second audio signal with a volume setting value to produce an adjusted average volume level, compares a difference between the average volume level of the first audio signal and the adjusted average volume level to a threshold value, and adjusts the audio level when the difference exceeds the threshold value.

In yet another implementation consistent with the present invention, a computer-readable medium having a packet data structure is provided. The packet data structure includes a volume setting field that stores a value representing a volume setting of an audio device and an audio sample field that stores at least one audio sample.

In still yet another implementation consistent with the present invention, a computer-readable medium having a packet data structure is provided. The packet data structure includes a destination address field that stores a destination address and a volume adjustment command field that stores a value indicating that a volume of an audio device is to be adjusted.

In yet a further implementation consistent with the present invention, a method adjusts an audio level of an audio device. The method includes receiving a first audio signal, the first audio signal comprising a plurality of sub-bands; receiving a data packet, the data packet comprising a second audio signal comprising a plurality of sub-bands; determining, for each sub-band, whether a difference between a sub-band of the first audio signal and a corresponding sub-band of the second audio signal exceeds a threshold value; and adjusting the audio level of a sub-band at the audio device when the difference between a sub-band of the first audio source and the corresponding sub-band of the second audio signal exceeds the threshold value.

BRIEF DESCRIPTION OF THE DRAWINGS

The accompanying drawings, which are incorporated in and constitute a part of this specification, illustrate an embodiment of the invention and, together with the description, explain the invention. In the drawings.

DETAILED DESCRIPTION

The following detailed description of implementations consistent with the present invention refers to the accompanying drawings. The same reference numbers in different drawings identify the same or similar elements. Also, the following detailed description does not limit the invention. Instead, the scope of the invention is defined by the appended claims and equivalents.

Implementations consistent with the present invention provide a process by which an audio level at a user may be maintained at a constant level. A local sensor is positioned in close proximity to the user. The local sensor interacts with the audio source in order to adjust the volume level of the audio source so that the user perceives a constant audio level.

Exemplary System Configuration

Figure 1:
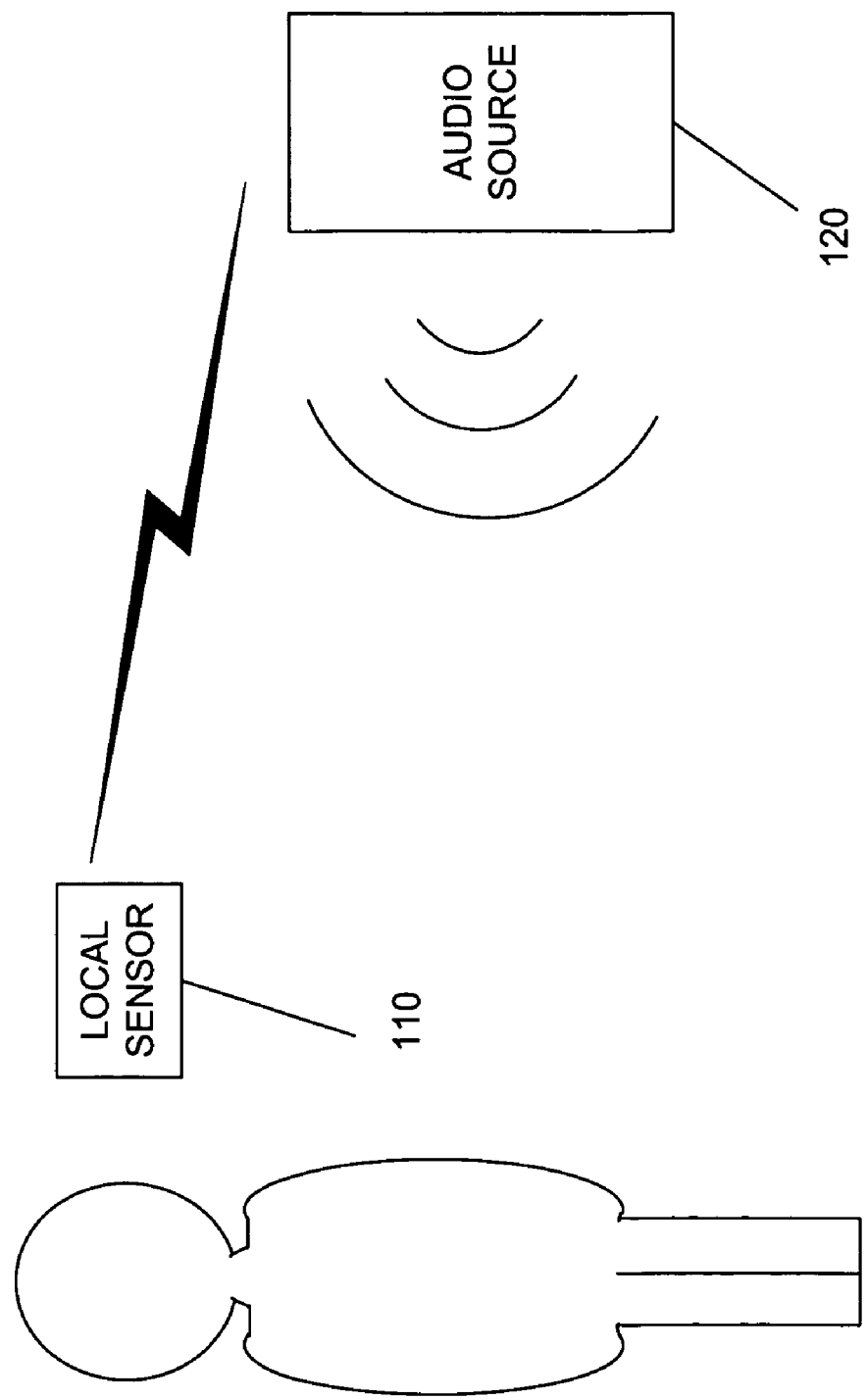
FIG. 1 illustrates an exemplary system in which systems and methods consistent with the present invention may be implemented.

FIG. 1 illustrates an exemplary system 100 in which systems and methods, consistent with the present invention, for maintaining a constant perceived audio level may be implemented. System 100 includes a local sensor 110 and an audio source 120. A single local sensor 110 and audio source 120 have been shown for simplicity. It will be appreciated that the techniques described herein are equally applicable to systems having multiple local sensors 110 and audio sources 120.

Local sensor 110 may include components for receiving sound waves, performing calculations on audio signals, and receiving and transmitting data packets to other devices or systems, such as audio source 120. Local sensor 110 may be employed as a small device attached to a listener's body, such as a watch-like device, a pager-like device, or a small microphone-like unit clipped to one's clothing. Alternately, local sensor 110 may be incorporated into a personal electronic device, a piece of clothing worn by a listener, or may be mounted near a listener, such as in an automobile or airplane.

Audio source 120 may include components for broadcasting audio signals in the form of sound waves and transmitting and receiving data packets to/from other devices or systems, such as local sensor 110. Audio source 120 may include the components of a portable personal radio, a stereo system, a car radio, an intercom system, or any other audio device. Audio source 120 may also include any device that broadcasts audio signals of any nature to a listener, such as a computer-like device or a telephone-like device.

Exemplary Local Sensor

Figure 2:
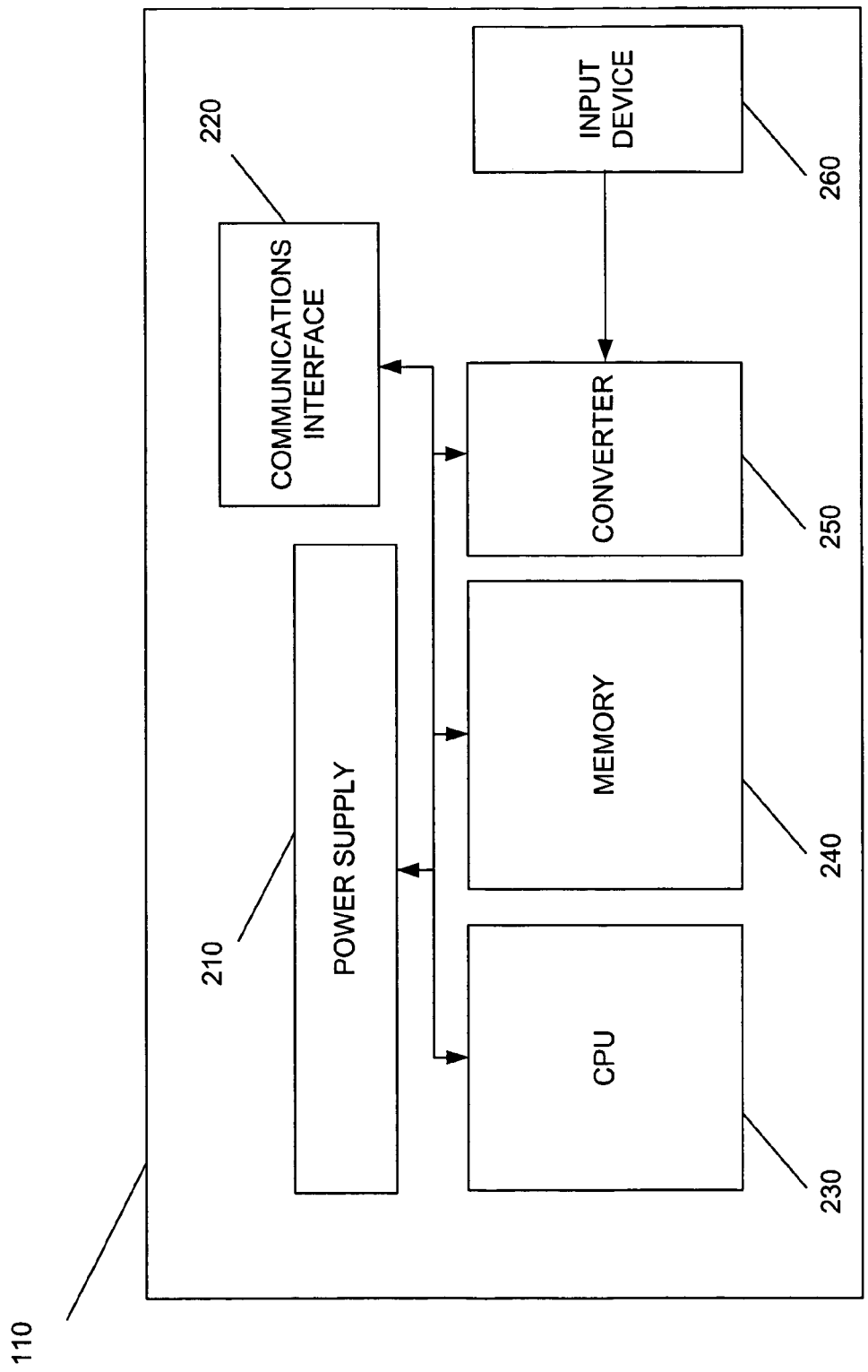
FIG. 2 illustrates an exemplary configuration of the elements of the local sensor of FIG. 1.

FIG. 2 illustrates an exemplary local sensor 110 configuration consistent with the present invention. In FIG. 2, the local sensor 110 includes a power supply 210, a communications interface 220, a central processing unit (CPU) 230, a memory 240, a converter 250, and an input device 260.

The power supply 210 may include all the components necessary to supply local sensor 110 with operating power. Power supply 210 may include a battery, fuel cell, solar collector, A/C adapter, or any other device capable of powering the components of local sensor 110. Alternately, power supply 210 may include a combination of devices capable of supplying power to local sensor 110.

The communications interface 220 may include any transceiver-like mechanism that enables local sensor 110 to communicate with other devices and/or systems, such as audio source 120, via a wired, wireless, optical, or any other type of connection. For example, communications interface 220 may include a modem or an Ethernet interface to a network. In an implementation consistent with the present invention, communications interface 220 may include an antenna, radio frequency (RF) transceiver, and modem by which local sensor 110 may transmit and receive data packets.

The CPU 230 may include any type of conventional processor or microprocessor that interprets and executes instructions in a well-known manner. Alternately, CPU 230 may consist of multiple processors or microprocessors, or some combination thereof. In general, CPU 230 may control the operation of local sensor 110.

The memory 240 may include a random access memory (RAM) or another type of dynamic storage device that stores information, such as information associated with the audio signals and data packets received by the local sensor, and instructions for execution by the CPU 230. In addition to RAM, memory 240 may also include a read only memory (ROM) or another type of static storage device that stores static information and instructions for use by the CPU 230, and/or some type of magnetic or optical recording medium and its corresponding drive.

The converter 250 may include components necessary to translate audio signals from an analog format to a digital format in a well-known manner. The input device 260, which may interact directly with converter 250, may include any conventional mechanism that allows local sensor 110 to receive information, such as a keypad, a mouse, a microphone, and the like.

Local sensor 110 operates in response to CPU 230 executing sequences of instructions contained in a computer-readable medium. A computer-readable medium may include one or more memory devices or carrier waves. Execution of the sequences of instructions causes CPU 230 to perform process steps that will be described hereafter.

In alternate embodiments, hard-wired circuitry may be used in place of or in combination with software instructions to implement the present invention. Thus, the present invention is not limited to any specific combination of hardware circuitry, software, and/or firmware.

Exemplary Audio Source

Figure 3:
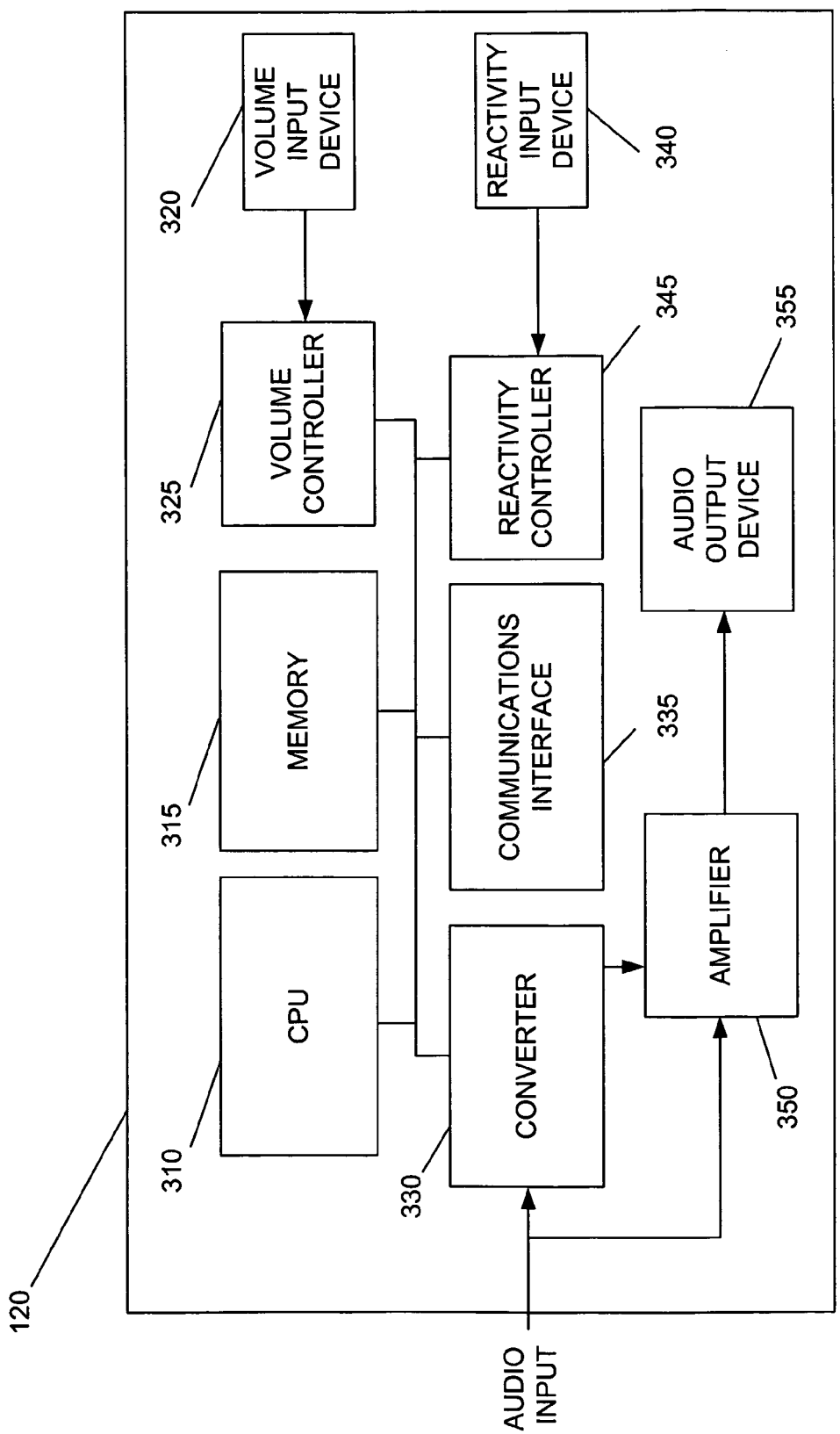
FIG. 3 illustrates an exemplary configuration of the elements of the audio source of FIG. 1.
Figure 4:
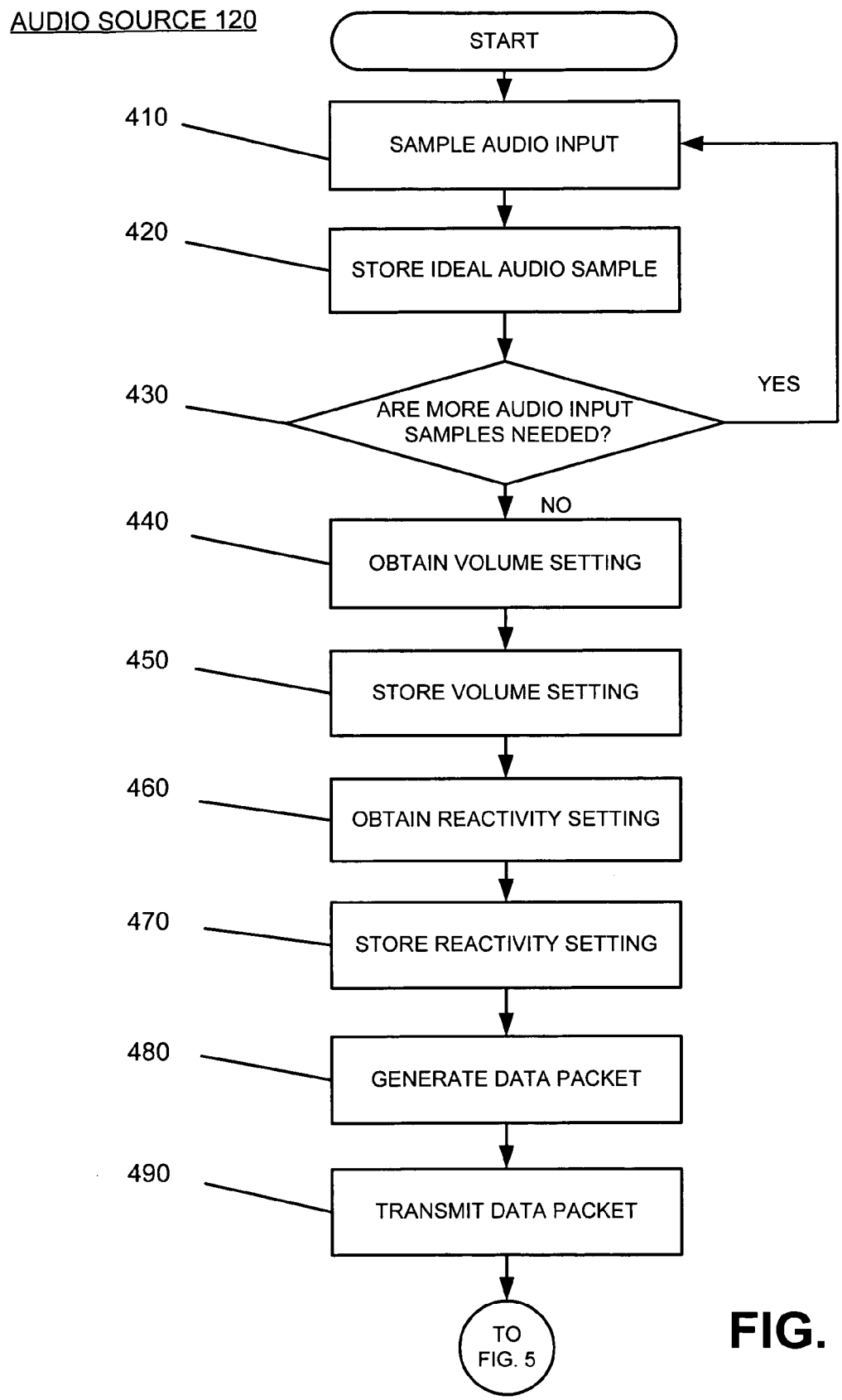
FIGS. 4–9 illustrate an exemplary process, consistent with the present invention, for maintaining a constant perceived audio level at a user.

FIG. 3 illustrates an exemplary audio source 120 configuration consistent with the present invention. In FIG. 3, the audio source 120 includes a CPU 310, a memory 315, a volume input device 320, a volume controller 325, a converter 330, a communications interface 335, a reactivity input device 340, a reactivity controller 345, an amplifier 350, and an audio output device 355.

The CPU 310 may include any type of conventional processor or microprocessor that interprets and executes instructions. Alternately, CPU 310 may consist of multiple processors or microprocessors, or some combination thereof. In general, CPU 310 may control the operation of audio source 120.

The memory 315 may include a RAM or another type of dynamic storage device that stores information, such as data packets, and instructions for execution by the CPU 310. In addition to RAM, memory 315 may include a read only memory (ROM) or another type of static storage device that stores static information and instructions for use by the CPU 310, and/or some type of magnetic or optical recording medium and its corresponding drive.

Volume input device 320 may include a user interface for adjusting the volume of the audio emanating from audio source 120. Volume input device 320 may consist of a dial, switch, or button that can be manually adjusted by a listener. In other applications, volume input device 320 may consist of an audio input device that receives verbal commands or an input device that receives signals transmitted from a remote control. Volume controller 325 may include one or more components that allow CPU 310 to sense the setting of volume input device 320.

Converter 330 may include all the components necessary to translate audio signals from an analog format to a digital format in a well-known manner. The communications interface 335 may include any transceiver-like mechanism that enables audio source 120 to communicate with other devices and/or systems, such as local sensor 110, via a wired, wireless, optical, or any other type of connection. For example, communications interface 335 may include a modem or an Ethernet interface to a network. In an implementation consistent with the present invention, communications interface 335 may include an antenna, radio frequency (RF) transceiver, and modem by which audio source 120 may transmit and receive data packets.

Reactivity input device 340 may include a user interface that allows a listener to adjust the rate at which the volume of audio source 120 is automatically changed in either a positive or negative direction. As used herein, a positive change in the volume of audio source 120 causes the sound level at the output of audio source 120 to increase (i.e. become louder) in contrast a negative change in the volume of audio source 120 causes the outputted sound to decrease (i.e. become quieter). Reactivity input device 340 may, for example, consist of a dial, switch, or button that can be manually adjusted by a listener. In other applications, reactivity input device 340 may consist of an audio input device that receives verbal commands or a device that receives signals transmitted from a remote control. Reactivity controller 345 may include one or more components that allow CPU 310 to sense the setting of reactivity input device 340.

Amplifier 350 may process the audio input signals in a well-known manner and provide them to audio output device 355. Audio output device 355 may include one or more components that convert audio signals into sound waves in a well-known manner. In an implementation consistent with the present invention, audio output device 355 may include one or more speakers.

It will be appreciated that audio source 120 may include additional hardware, software, and/or firmware components (not shown) to perform the functions associated with the operation of various types of audio sources 120, such as radios, stereos, televisions, telephones, and the like. Audio source 120 operates in response to CPU 310 executing sequences of instructions contained in a computer-readable medium. A computer-readable medium may include one or more memory devices or carrier waves. Execution of the sequences of instructions causes CPU 310 to perform the process steps that will be described hereafter.

In alternate embodiments, hard-wired circuitry may be used in place of or in combination with software instructions to implement the above components. Thus, the present invention is not limited to any specific combination of hardware circuitry, software, and/or firmware.

Exemplary Processing

FIGS. 4–9 illustrate an exemplary process, consistent with the present invention, for maintaining a constant perceived audio level at a user location. Processing begins with the audio source 120 sampling an incoming audio signal, such as the audio input in FIG. 3 [step 410]. Since the audio signal is sampled at its source, the signal may be considered "ideal." The audio source 120 may store a predetermined number of ideal audio samples in, for example, memory 315 [step 420]. As will be appreciated later, the audio source 120 may store a predetermined number of ideal audio samples to allow the local sensor 110 to determine whether a volume adjustment is necessary. If the predetermined number of samples has not yet been stored [step 430], the audio source 120 may collect additional samples.

When the predetermined number of ideal audio samples has been collected [step 430], the audio source 120 may obtain the current volume setting [step 440]. The audio source 120 may obtain the current volume setting from the volume controller 325. Once obtained, the audio source 120 may store that information in memory 315 [step 450]. The audio source 120 may also obtain the current reactivity setting from reactivity controller 345 [step 460], and may store that information in memory 315 [step 470].

Figure 10:
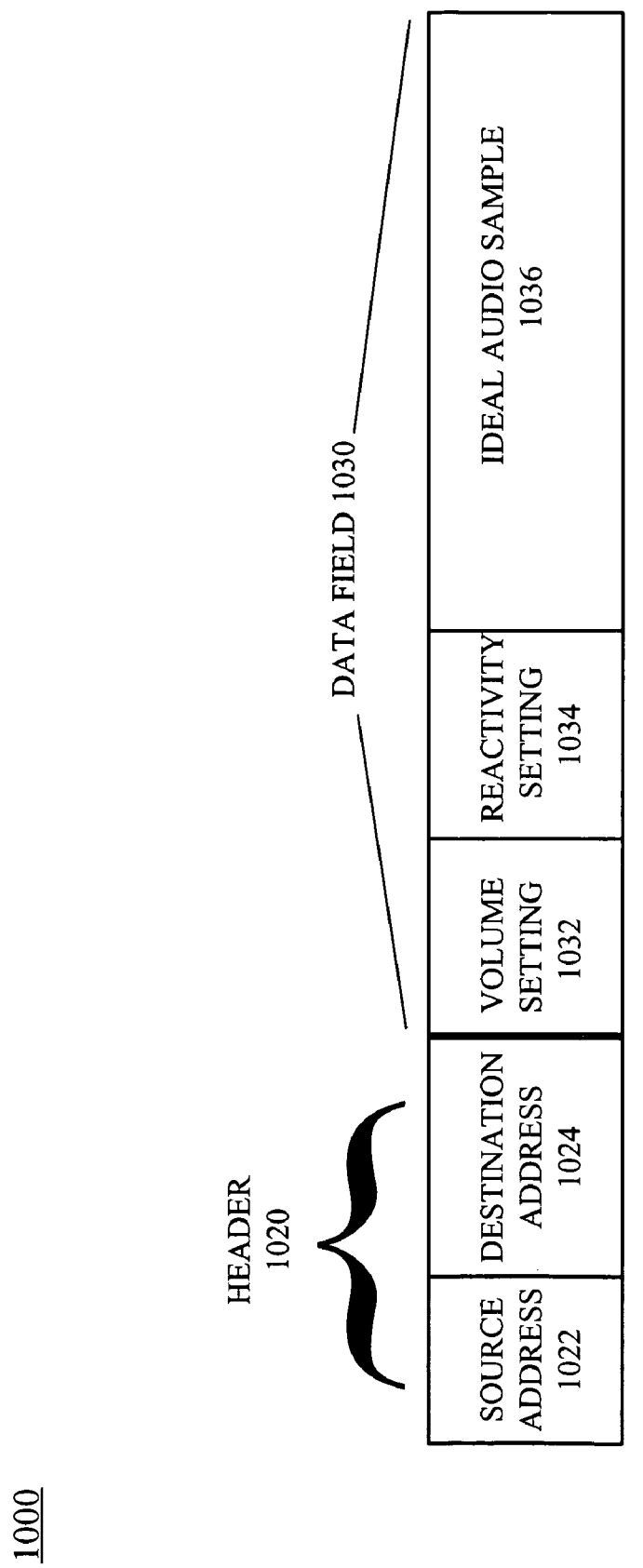
FIG. 10 illustrates an exemplary configuration, consistent with the present invention, of a data packet generated by audio source.

After retrieving the ideal audio samples, the volume setting, and the reactivity setting, the audio source 120 may generate a data packet for transmission to the local sensor 110 [step 480]. FIG. 10 illustrates an exemplary configuration, consistent with the present invention, of a data packet 1000 generated by audio source 120. As illustrated, the data packet 1000 may include a header 1020 and a data field 1030.

The header 1020 may contain the overhead information associated with the process of transmitting data over a communications channel. The header 1020 may include a source address 1022 and a destination address 1024. Source address 1022 may include a unique identifier that represents the address of the source transmitting data packet 1000. In this case, the source address may identify the audio source 120. Destination address 1024 may include a unique identifier that represents the address of the recipient of data packet 1000 (i.e., local sensor 110). It will be appreciated that a typical packet header may include additional fields (not shown), such as a length field, an error correction field, and the like.

Data field 1030 may represent the portion of data packet 1000 that contains the actual data for which the transmission is being made. Data field 1030 may include multiple fields of information, such as a volume setting 1032, a reactivity setting 1034, and an ideal audio sample 1036. The volume setting 1032 may include an indication of a current setting of volume input device 320. The reactivity setting 1034 may include an indication of a current setting of reactivity input device 340. The ideal audio sample 1036 may contain the ideal audio signals sampled by audio source 120.

While a packet structure having a header has been set forth, it will be appreciated that the above description is equally applicable to a packet structure having a trailer or any other similar or equivalent format.

After generating the data packet 1000, audio source 120 may then transmit the data packet 1000 to the local sensor 110 [step 490]. The data packet 1000 may be transmitted via communications interface 335 to the local sensor 110 in any well-known manner, such as by any wireless, wired, or optical technique.

Figure 5:
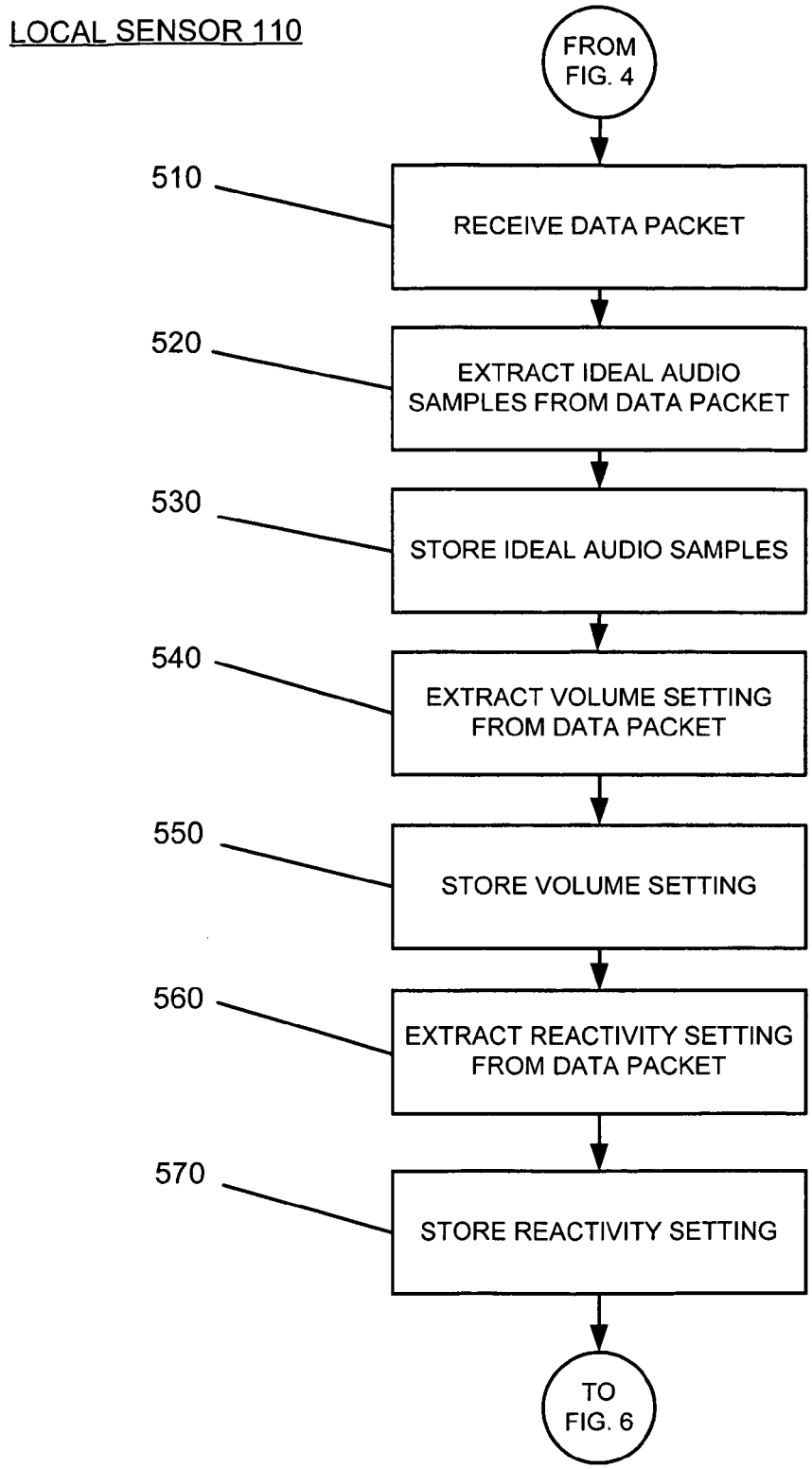

The local sensor 110 may receive data packet 1000 via, for example, communications interface 220 [step 510] (FIG. 5). The local sensor 110 may then extract the ideal audio sample 1036 transmitted in data packet 1000 [step 520] and store this information in memory 240 [step 530].

Local sensor 110 may extract the volume setting information 1032 transmitted in data packet 1000 [step 540]. As indicated above, this information may represent a current volume setting value of the volume input device 320. Local sensor 110 may store the volume setting value in, for example, memory 240 [step 550].

Local sensor 110 may extract the reactivity setting information 1034 transmitted in data packet 1000 [step 560]. As indicated above, this information may represent a current reactivity setting value of the reactivity input device 340. Local sensor 110 may store the reactivity setting value in memory 240 [step 570].

Figure 6:
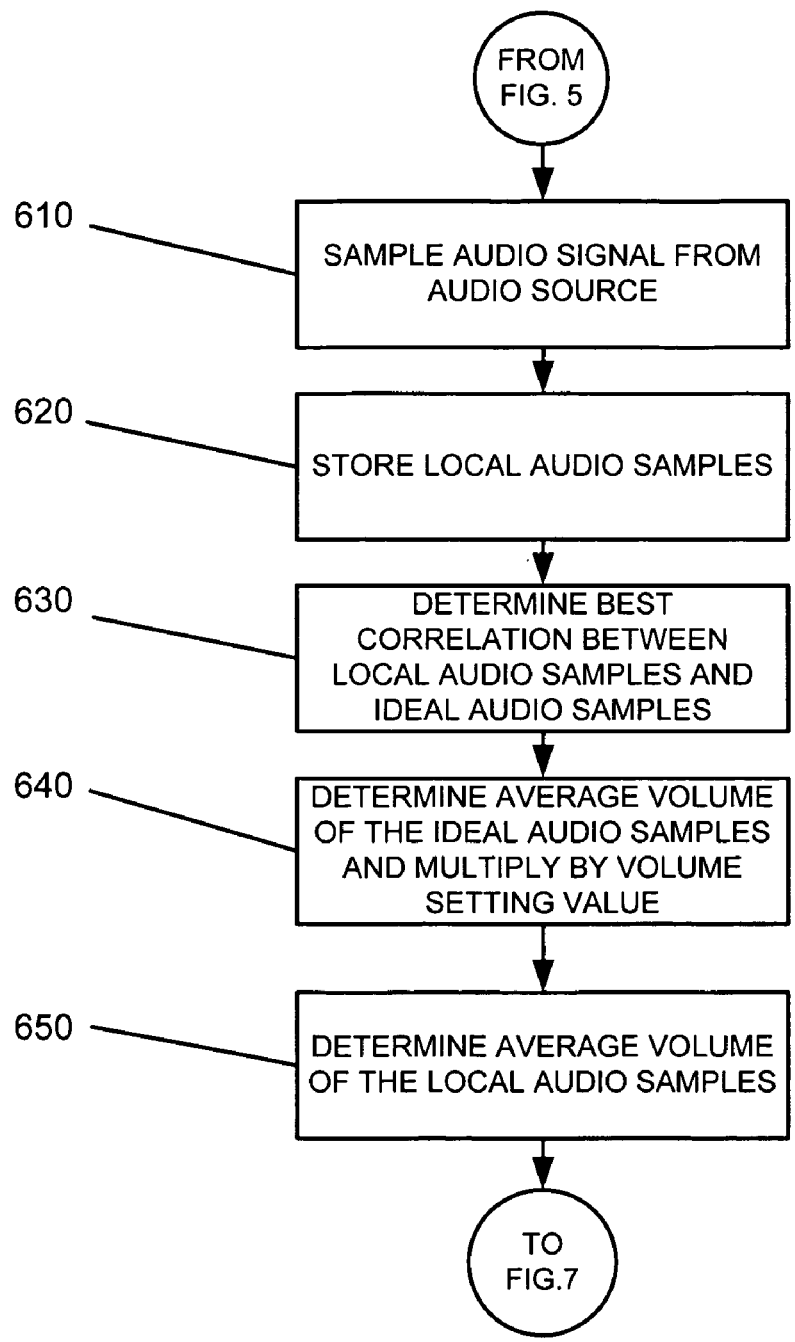

To determine whether a volume adjustment is necessary, the local sensor 110 may sample the audio signals transmitted by audio source 120 via its audio output device 355 [step 610] (FIG. 6). The local sensor 110 may receive the audio samples via, for example, its input device 260. These audio samples are referred to hereinafter as "local audio samples." The local sensor 110 may then store the local audio samples in, for example, memory 240 [step 620].

The local sensor 110 may determine the best correlation between the local audio samples received through input device 260, and the ideal audio samples received in data packet 1000 [step 630]. In general, there may be some delay between the two samples, and the local audio sample may be corrupted from the ideal audio samples due to extraneous noise picked up by the local sensor's input device 260. The local sensor 110 may use any of the conventional techniques well known in the art to correlate or line-up the two corresponding samples. The local sensor 110 may then determine the average volume of the ideal audio samples [step 640] and the local audio samples [step 650] in a well-known manner. The average volumes may be determined in any number of classical ways, such as simple averaging, time series averaging, or any other standard method.

The local sensor 110 may multiply the average value for the ideal audio samples by the volume setting value 1032 received in the data packet 1000 in order to adjust the desired value to a level consistent with the user's volume setting [step 640].

Figure 7:
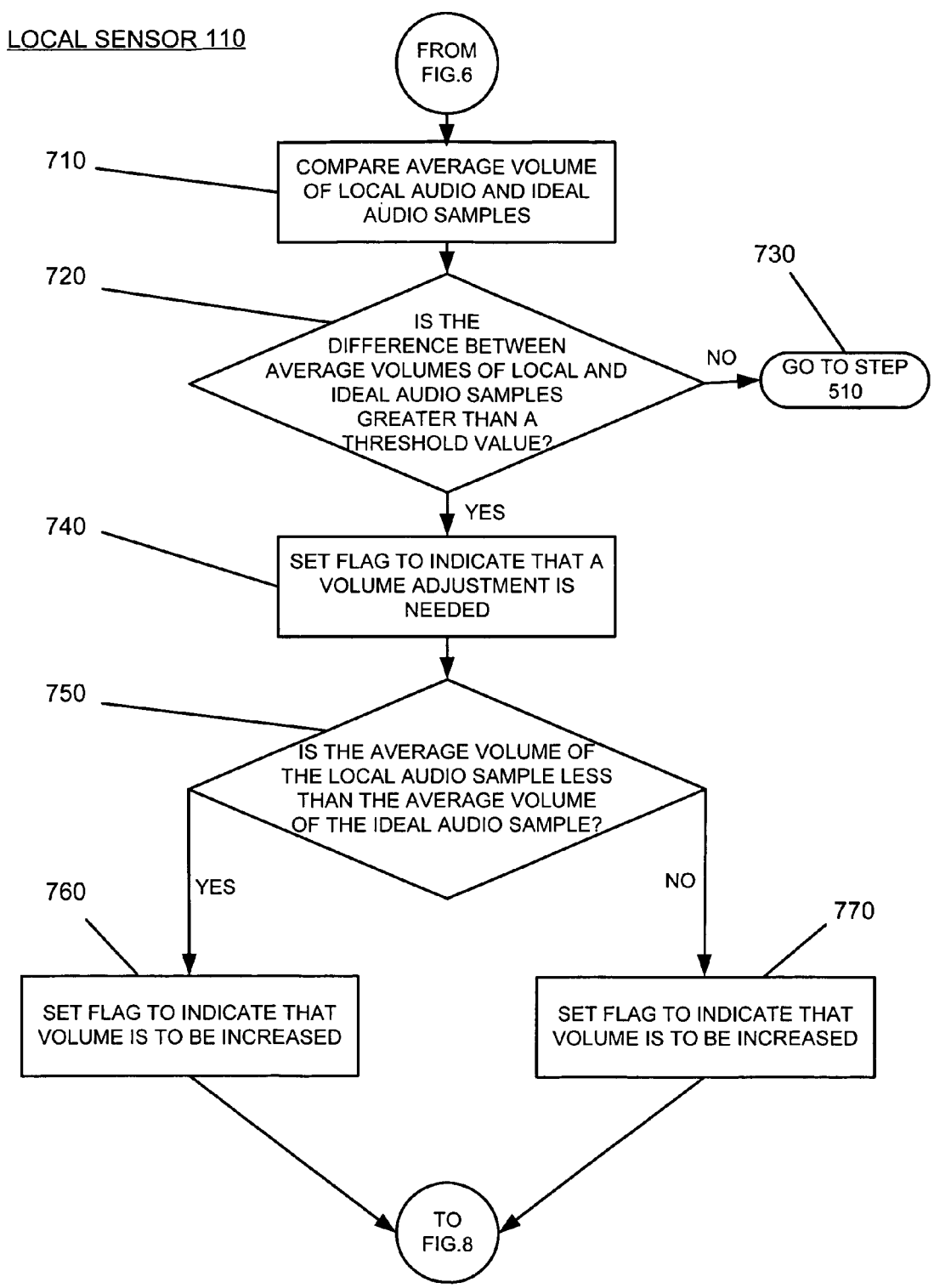
Figure 11:
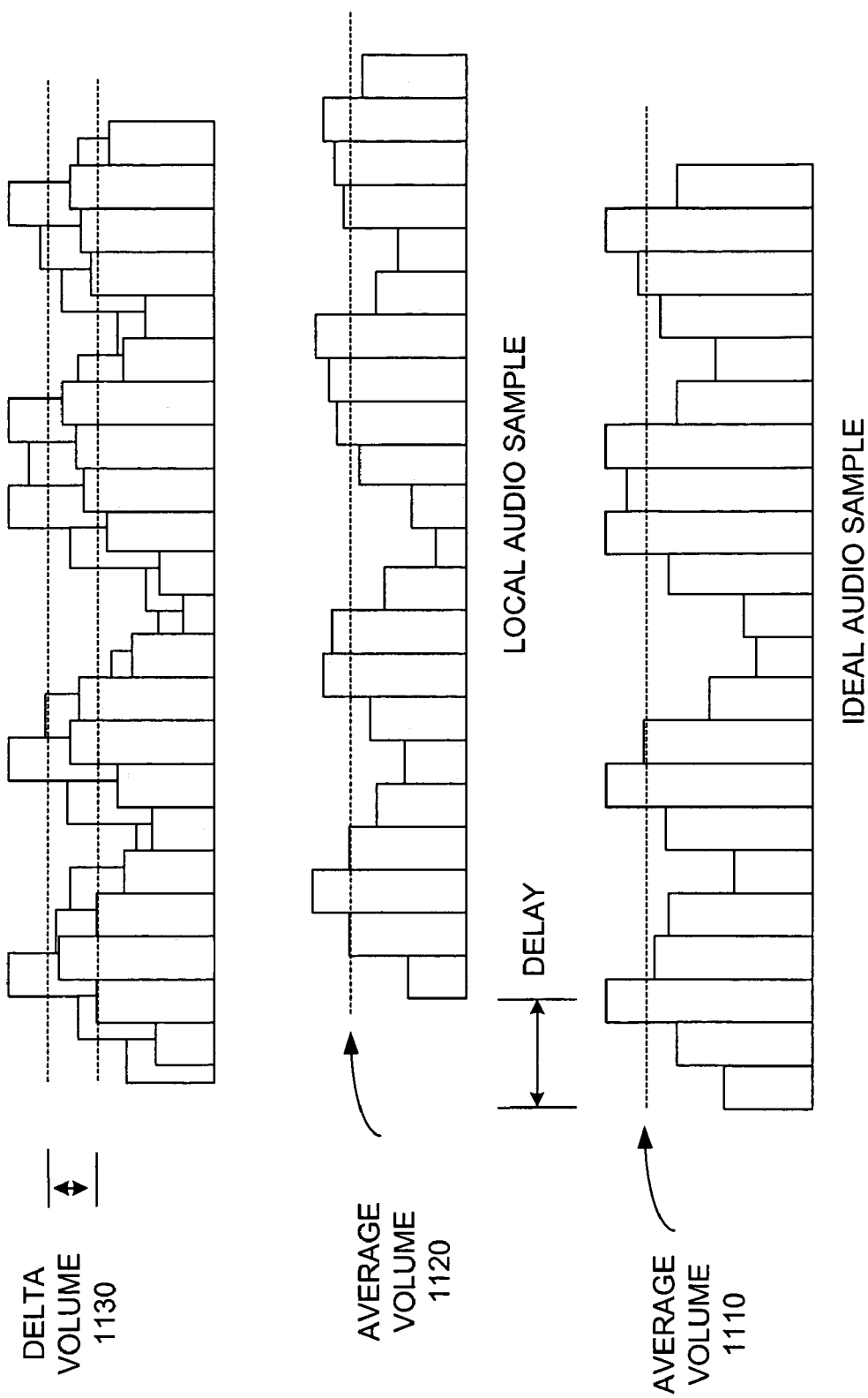
FIG. 11 illustrates an exemplary comparison operation consistent with the present invention.

The local sensor 110 may then compare the average volumes of the ideal audio sample and the local audio sample in a well-known manner [step 710] (FIG. 7). FIG. 11 illustrates an exemplary comparison operation consistent with the present invention. As illustrated, the local sensor 110 determines an average volume level 1110 for the ideal audio sample received in data packet 1000. The local sensor 110 also determines an average volume level 1120 for the local audio samples captured by input device 260. The local sensor 110 may then compare the two average volumes to arrive at a delta volume 1130 as illustrated by the difference between the dashed lines in FIG. 11. The delta volume may represent the average difference between the ideal audio sample and the local audio sample.

Local sensor 110 may then determine if the average difference between the ideal audio sample and the local audio sample (i.e., the delta volume 1130) is greater than a threshold value [step 720]. The threshold value may represent a value, below which it is determined that the two audio samples are close enough such that no volume adjustments are necessary. This threshold value may be set, for example, by the user or manufacturer of local sensor 110.

If the local sensor 110 determines that the average difference between the local audio samples and the ideal audio samples is below or less than the threshold value, then no immediate volume adjustment is necessary and local sensor 110 may return to step 510 [step 730]. If the average difference between the local audio samples and the ideal audio samples is greater than the threshold value, local sensor 110 may set a flag or indicator that a volume adjustment at audio source 120 is warranted [step 740]. The local sensor 110 may store this flag in memory 240 until needed.

Local sensor 110 may then determine if the average volume of the local audio signal is less than the average volume of the ideal audio sample [step 750]. This may be determined, for example, by subtracting one average volume from the other. If the average volume of the local audio sample is less than the average volume of the ideal audio sample, then local sensor 110 may set a flag to indicate that a volume increase is warranted [step 760]. If the average volume of the local audio sample is greater than the average volume of the ideal audio sample, then local sensor 110 may set a flag to indicate that a volume decrease is warranted [step 770].

Figure 8:
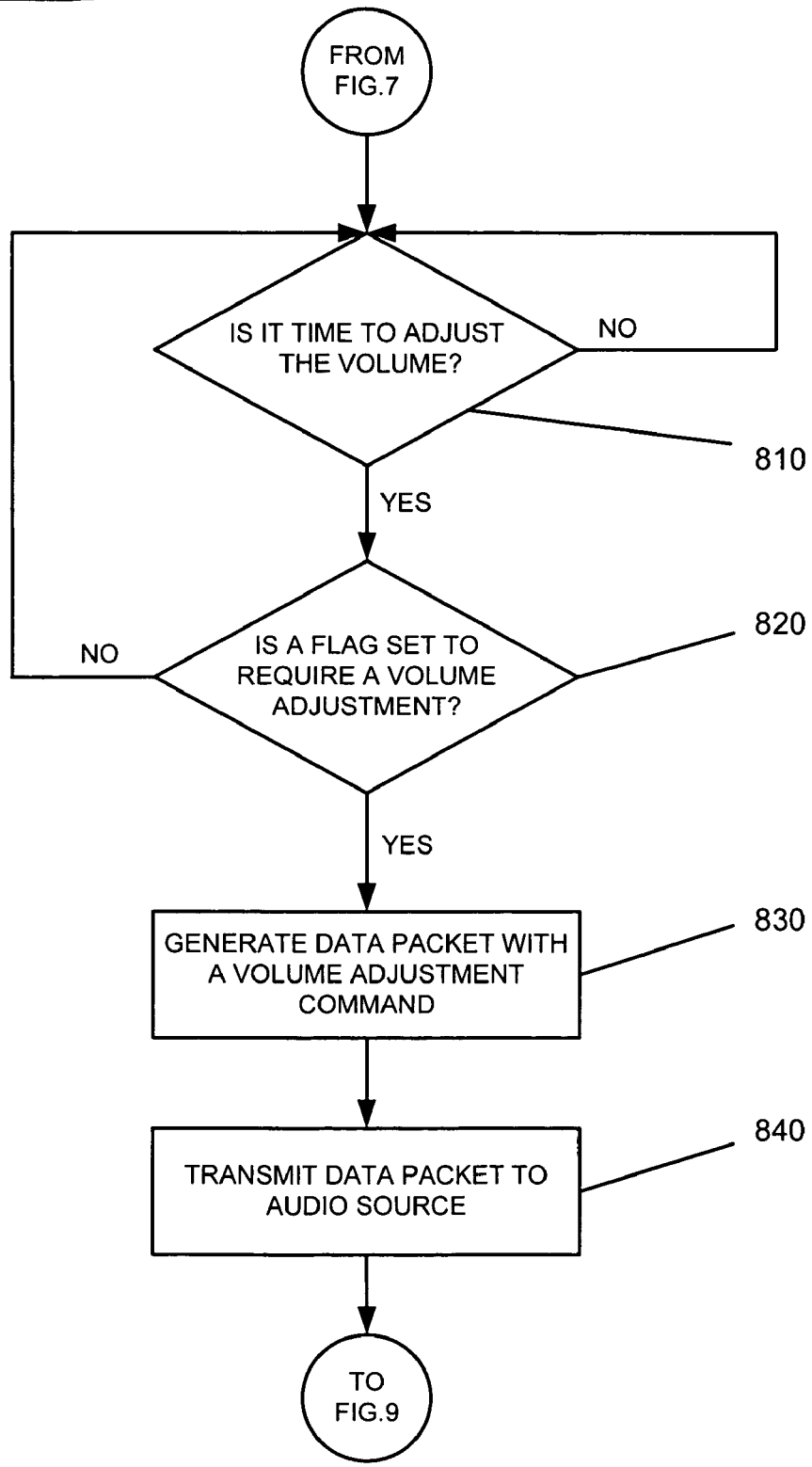

Once local sensor 110 determines that a volume adjustment is necessary, the local sensor 110 may then determine if it is time to adjust the volume of audio source 120 [step 810] (FIG. 8). The local sensor 110 may query memory 240 to obtain the reactivity setting 1034 that was transmitted from the audio source 120 in data packet 1000. The local sensor 110 may then determine how long it has been since the last volume adjustment command has been sent to the audio source 120, and based on that time along with the reactivity setting 1034 may determine if it is time to send the another volume adjustment command. If a predetermined amount of time has not elapsed since the last volume adjustment, local sensor 110 may delay any future adjustments until the appropriate time.

If the delay since the last volume adjustment command was sent is consistent with the value of the reactivity setting, then local sensor 110 may determine if a flag is set indicating that either an increase or decrease in the volume is warranted [step 820]. If a flag is not set, indicating that no volume adjustment is necessary, then local sensor 110 may wait until the end of the next time period before looking again for the flag indicating whether an adjustment is necessary.

Figure 12:
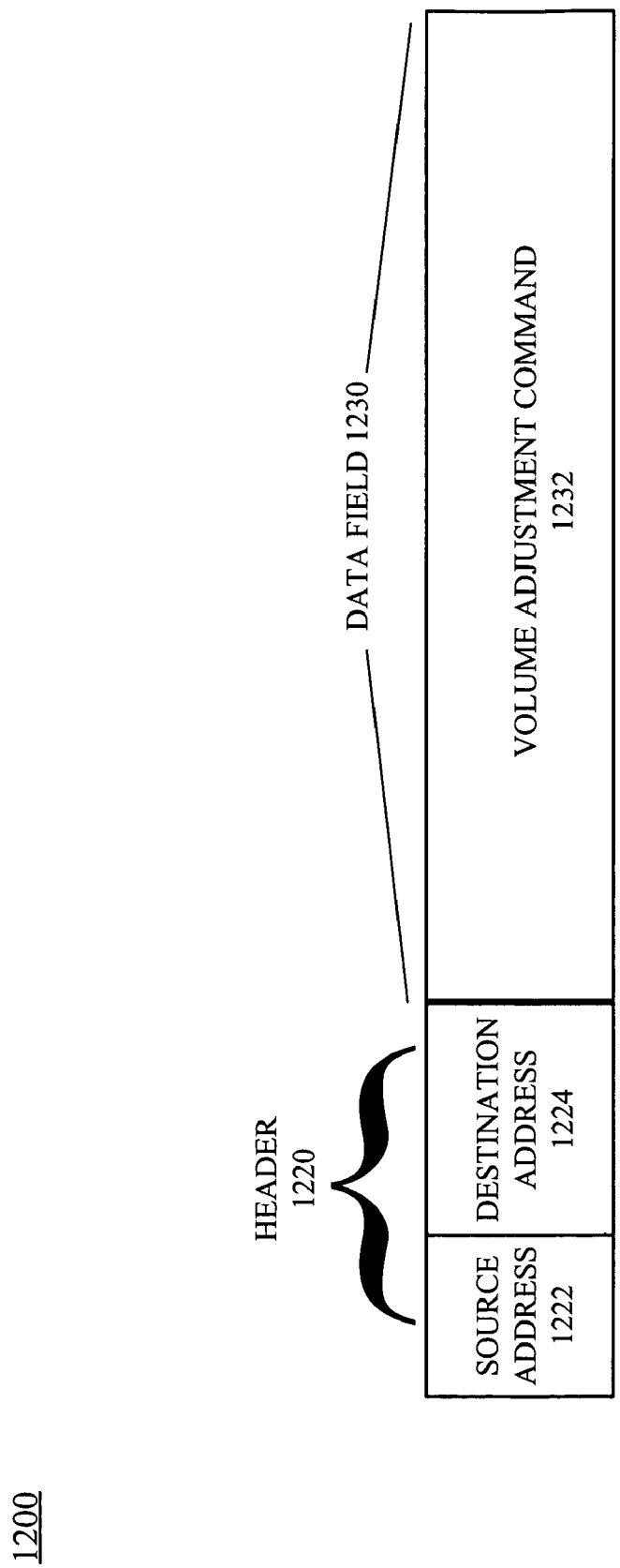
FIG. 12 illustrates an exemplary configuration, consistent with the present invention, for the data packet transmitted by local sensor.
Figure 13:
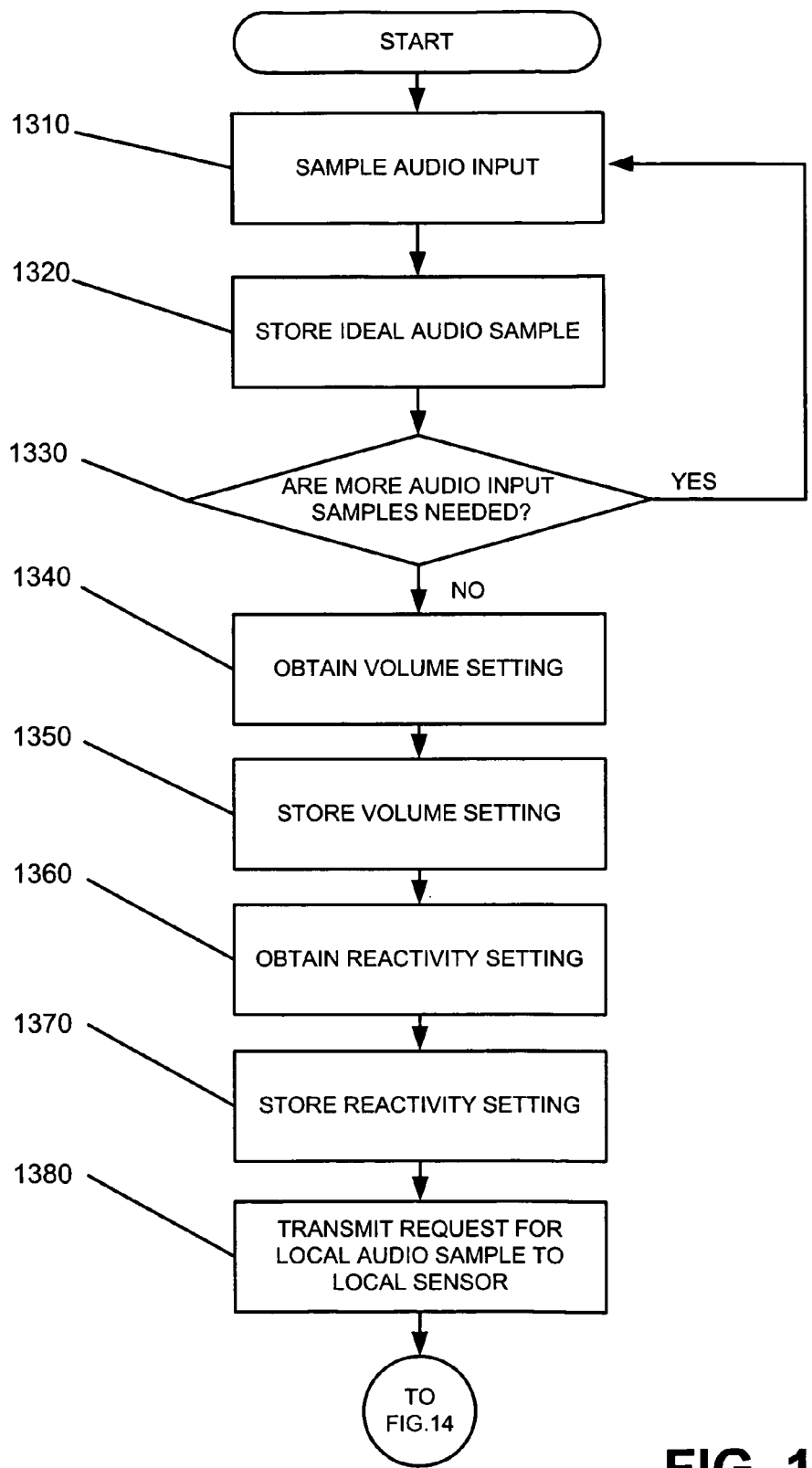
FIGS. 13–17 an alternative exemplary process, consistent with the present invention, for maintaining a constant perceived audio level at a user.

If a flag is set to indicate that a volume adjustment is necessary, then local sensor 110 may generate a data packet containing the volume adjustment command [step 830]. FIG. 12 illustrates an exemplary configuration 1200, consistent with the present invention, for the data packet transmitted by local sensor 110. As illustrated, data packet 1200 may include a header 1220 and a data field 1230.

The header 1220 may contain overhead information associated with the process of transmitting data over a communications channel. As illustrated, the header 1220 may include a source address 1222 and a destination address 1224. Source address 1222 may include a unique identifier that represents the address of the source transmitting data packet 1200. In this case, the source address would identify the local sensor 110. Destination address 1224 may include a unique identifier that represents the address of the recipient of data packet 1200 (i.e., audio source 120). It will be appreciated that a typical packet header may include additional fields (not shown), such as a length field, an error correction field, and the like.

Data field 1230 may represent the portion of data packet 1200 that contains the actual data for which the transmission is being made. Data field 1230 may include, for example, a volume adjustment command 1232. The volume adjustment command 1232 may include a command to either increase or decrease the volume of audio source 120. The volume adjustment command 1232 may include a value (not shown) representing the amount that the volume of audio source 120 is to be adjusted.

While a packet structure having a header has been set forth, it will be appreciated that the above description is equally applicable to a packet structure having a trailer or any other similar or equivalent format.

Local sensor 110 may then transmit data packet 1200 to audio source 120 [step 840]. The local sensor 110 may transmit the data packet 1200 in any well-known manner, such as by any wireless, wired, or optical technique.

Figure 9:
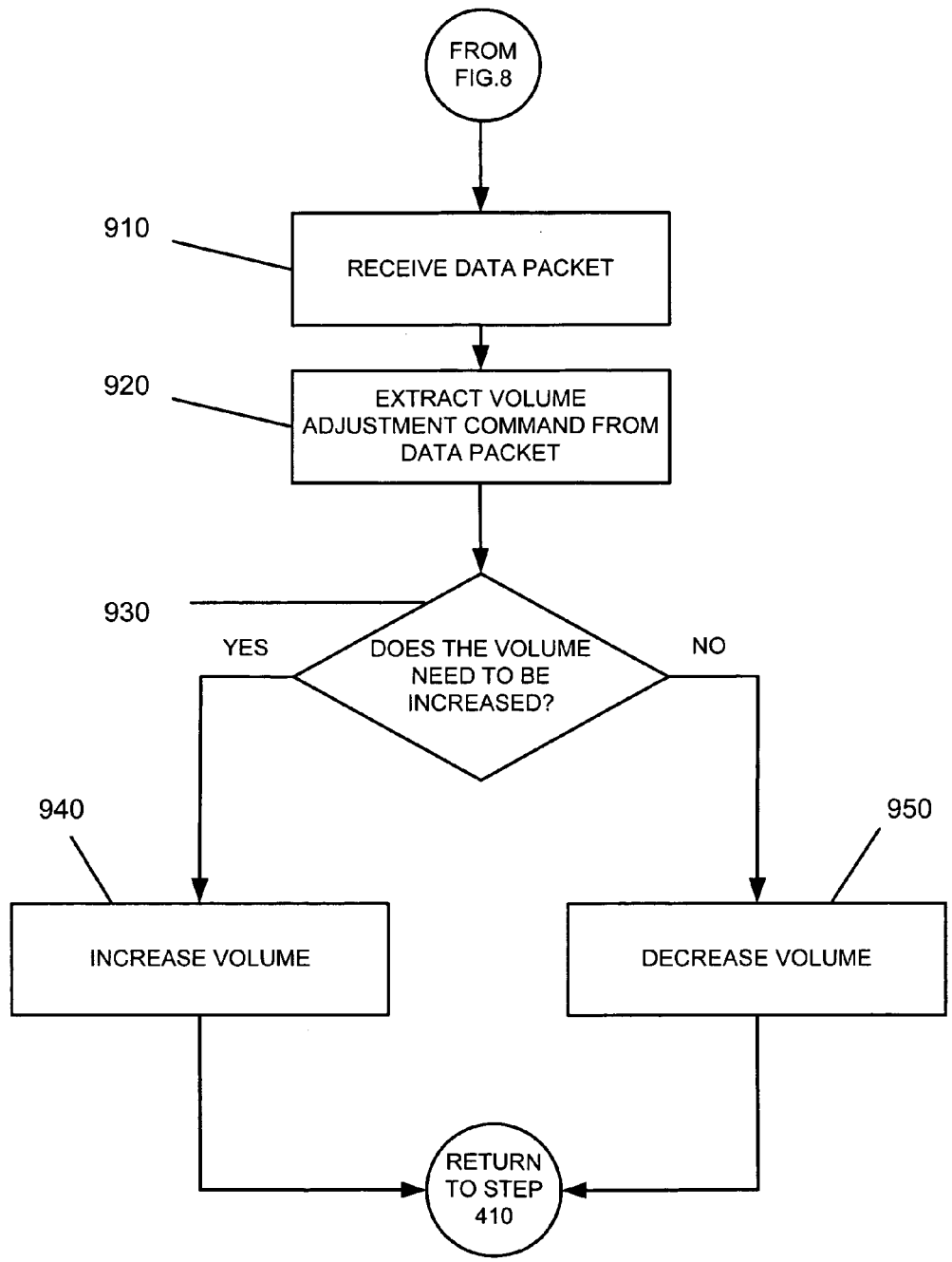

The audio source 120 may receive the data packet 1200 from local sensor 110 via, for example, communications interface 335 [step 910] (FIG. 9). Audio source 120 may extract the volume adjustment command 1232 from the data packet 1200 in a well-known manner [step 920]. After extracting the volume adjustment command 1232, audio source 120 may determine whether the volume needs to be increased [step 930]. For illustration purposes, the volume adjustment command 1232 could consist of a single binary digit. A value of "0" may indicate that the volume needs to be decreased, and a value of "1" may indicate to audio source 120 that the volume needs to be increased.

If audio source 120 determines that an increase in volume is warranted, the audio source 120 may increase the volume incrementally [step 940]. CPU 310 may increase the gain of amplifier 350 and hence the volume of audio output device 355 which may, for example, consist of one or more standard speakers. If audio source 120 determines that a decrease in volume is warranted, the audio source 120 may decrease the volume incrementally [step 950]. In this case, for example, CPU 310 may reduce the gain of amplifier 350, and hence the volume of audio output device 355.

Alternative Exemplary Processing

FIGS. 13–17 illustrate an alternative exemplary process, consistent with the present invention, for maintaining a constant perceived audio level at a user. Processing may begin with the audio source 120 sampling an incoming audio signal, such as the audio input in FIG. 3 [step 1310]. Since the audio signal is sampled at its source, the signal may be considered "ideal." The audio source 120 may store a predetermined number of ideal audio samples in, for example, memory 315 [step 1320]. As will be appreciated later, the audio source 120 may store a predetermined number of ideal audio samples to determine whether a volume adjustment is necessary. If the predetermined number of samples has not been stored [step 1330], the audio source 120 may collect additional samples.

When the predetermined number of ideal audio samples has been collected [step 1330], the audio source 120 may obtain the current volume setting [step 1340]. The audio source 120 may obtain the current volume setting from the volume controller 325. Once obtained, the audio source 120 may store that information in memory 315 [step 1350]. The audio source 120 may also obtain the current reactivity setting from reactivity controller 345 [step 1360], and may store that information in memory 315 [step 1370]. Once this information is stored, the audio source 120 may transmit a request to the local sensor 110 for local audio sample [step 1380].

Figure 14:
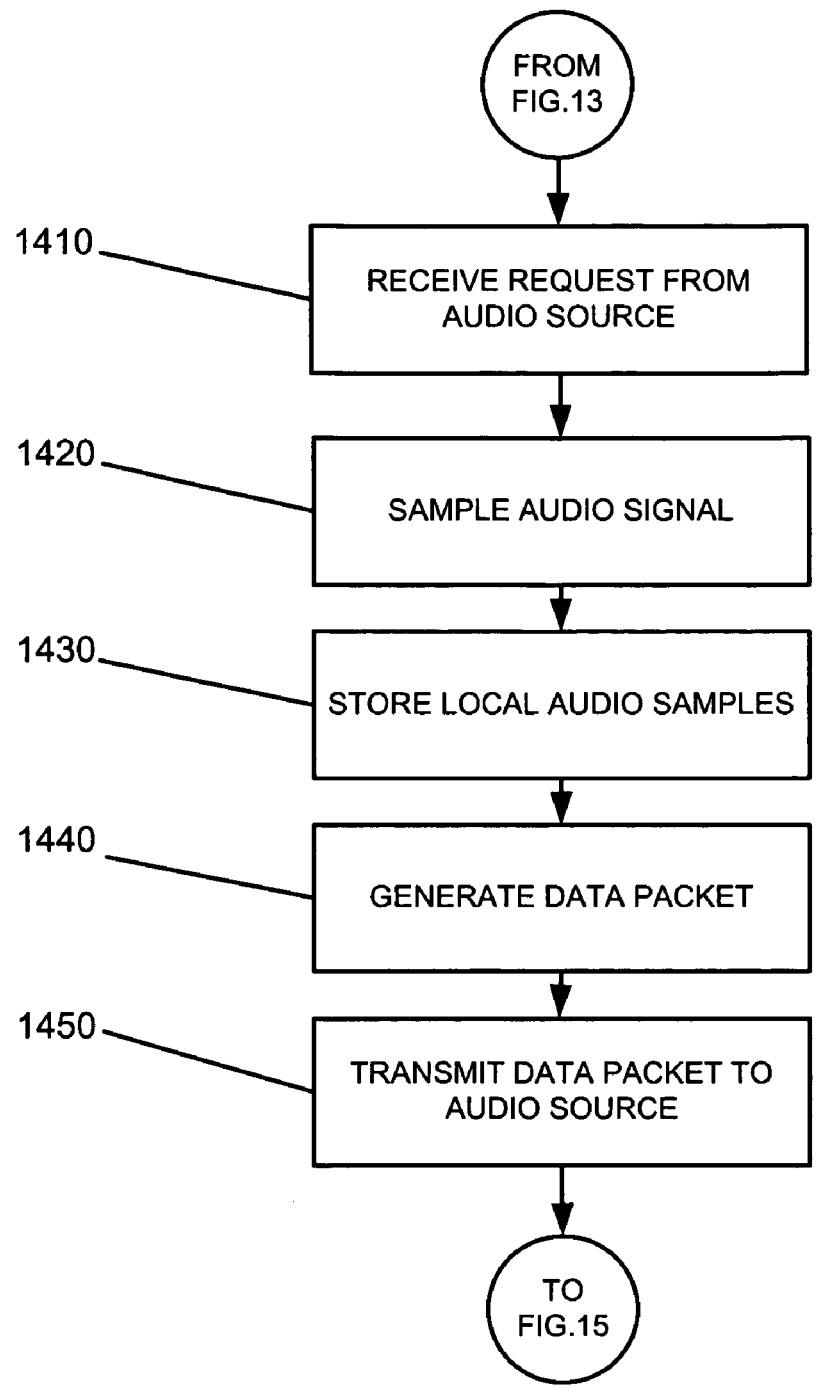

The local sensor 110 may receive the request from the audio source 120 [step 1410] (FIG. 14). In response thereto, the local sensor 110 may sample local audio signals in the form of sound waves from audio source 120 via, for example input device 260 [step 1420] (FIG. 14). In other implementations consistent with the present invention, the local sensor 110 may automatically sample the local audio signals at predetermined periods of time. The local sensor 110 may store the local audio samples in memory 240 [step 1430].

Figure 18:
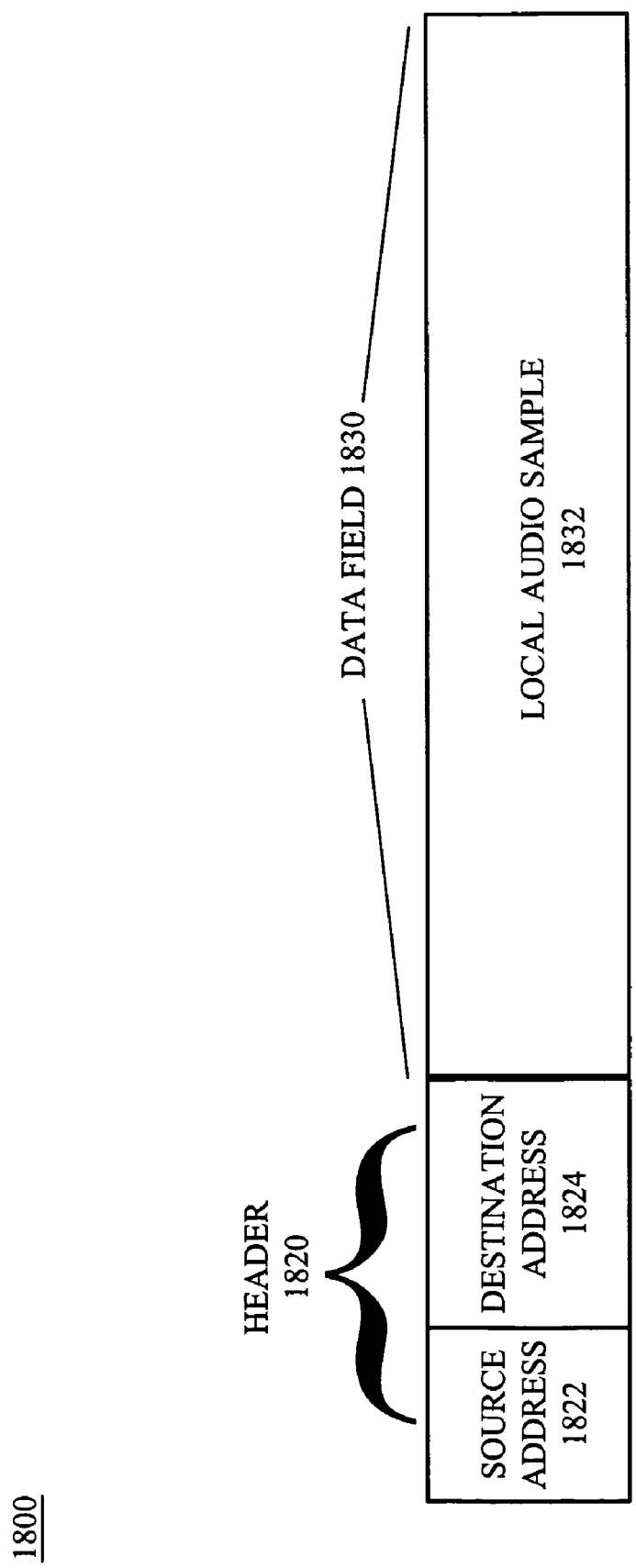
FIG. 18 an exemplary configuration, consistent with the present invention, for the data packet transmitted by local sensor.

Local sensor 110 may then generate a data packet containing the local audio samples [step 1440]. FIG. 18 illustrates an exemplary configuration 1800, consistent with the present invention, for the data packet transmitted by local sensor 110. As illustrated, data packet 1800 may include a header 1820 and a data field 1830.

The header 1820 may contain overhead information associated with the process of transmitting data over a communications channel. As illustrated, the header 1820 may include a source address 1822 and a destination address 1824. Source address 1822 may include a unique identifier that represents the address of the source transmitting the data packet. In this case, the source address would identify the local sensor 110. Destination address 1824 may include a unique identifier that represents the address of the recipient of data packet 1800 (i.e., audio source 120). It will be appreciated that a typical packet header may include additional fields (not shown), such as a length field, an error correction field, and the like.

Data field 1830 may represent the portion of data packet 1800 that contains the actual data for which the transmission is being made. Data field 1830 may include, for example, the local audio samples 1832. The local audio samples 1832 may include the audio samples received by local sensor 110 from audio source 120 in the form of sound waves. These samples may be received, for example, via input device 260, and may represent the state of the local audio signals in the proximity of the user.

While a packet structure having a header has been set forth, it will be appreciated that the above description is equally applicable to a packet structure having a trailer or any other similar or equivalent format.

Local sensor 110 may then transmit data packet 1800 to audio source 120 [step 1450]. The local sensor 110 may transmit the data packet 1800 in any well-known manner, such as by any wireless, wired, or optical technique.

Figure 15:
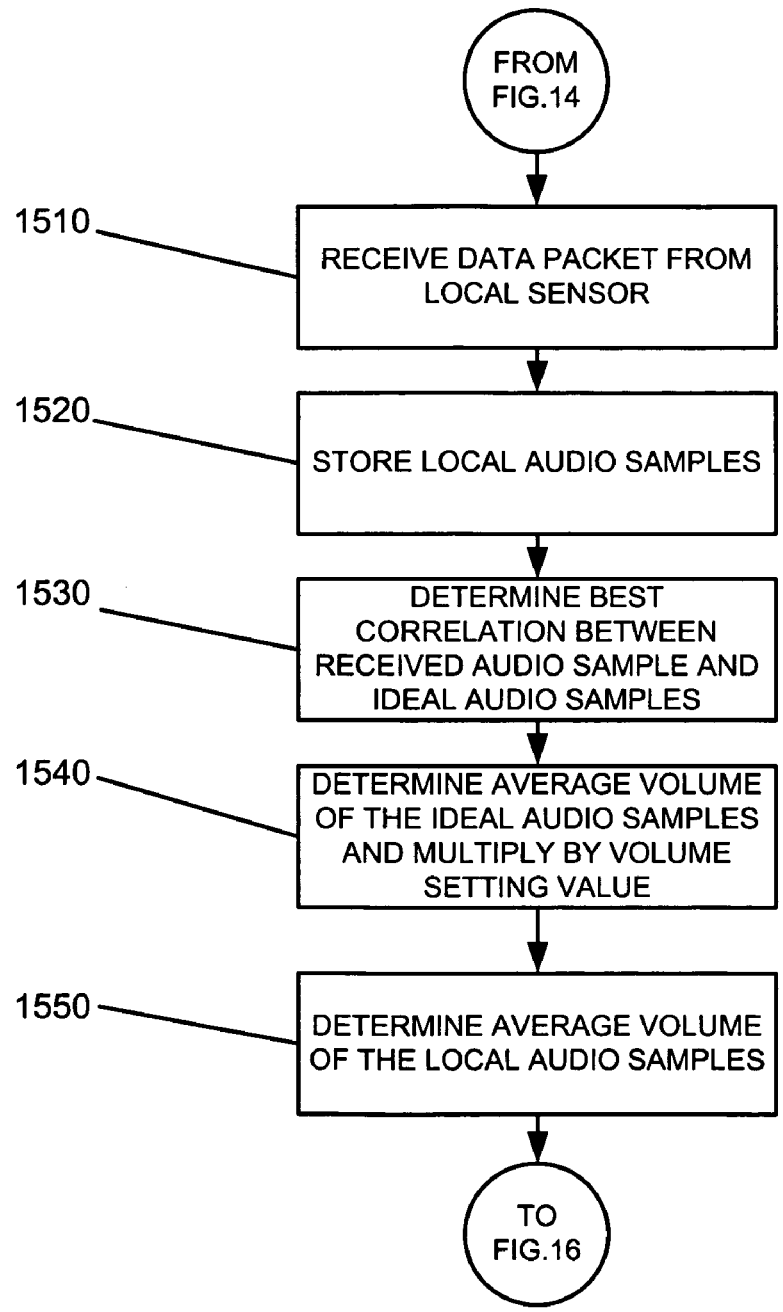

The audio source 120 may receive the data packet 1800 from local sensor 110 via, for example, communications interface 335 [step 1510] (FIG. 15). Audio source 120 may extract the local audio samples 1832 from the data packet 1800 in a well-known manner, and may store this information in memory 315 [step 1520].

The audio source 120 may then determine the best correlation between the local audio samples and the ideal audio samples now stored in memory 315 [step 1530]. In general, there may be some delay between the two samples, and the local audio sample may be corrupted from the ideal audio samples due to extraneous noise picked up by the local sensor's input device 260. The audio source 120 may use any of the conventional techniques well known in the art to correlate or line-up the two corresponding samples. The audio source 120 may then determine the average volume of the ideal audio samples [step 1540] and the local audio samples [step 1550] in a well-known manner. The average volumes may be determined in any number of classical ways, such as simple averaging, time series averaging, or any other standard method. The audio source 120 may multiply the average value for the ideal audio samples by the volume setting value previously stored in memory 315, or obtained from the volume controller 325, in order to adjust the desired value to a level consistent with the user's volume setting [step 1540].

Figure 16:
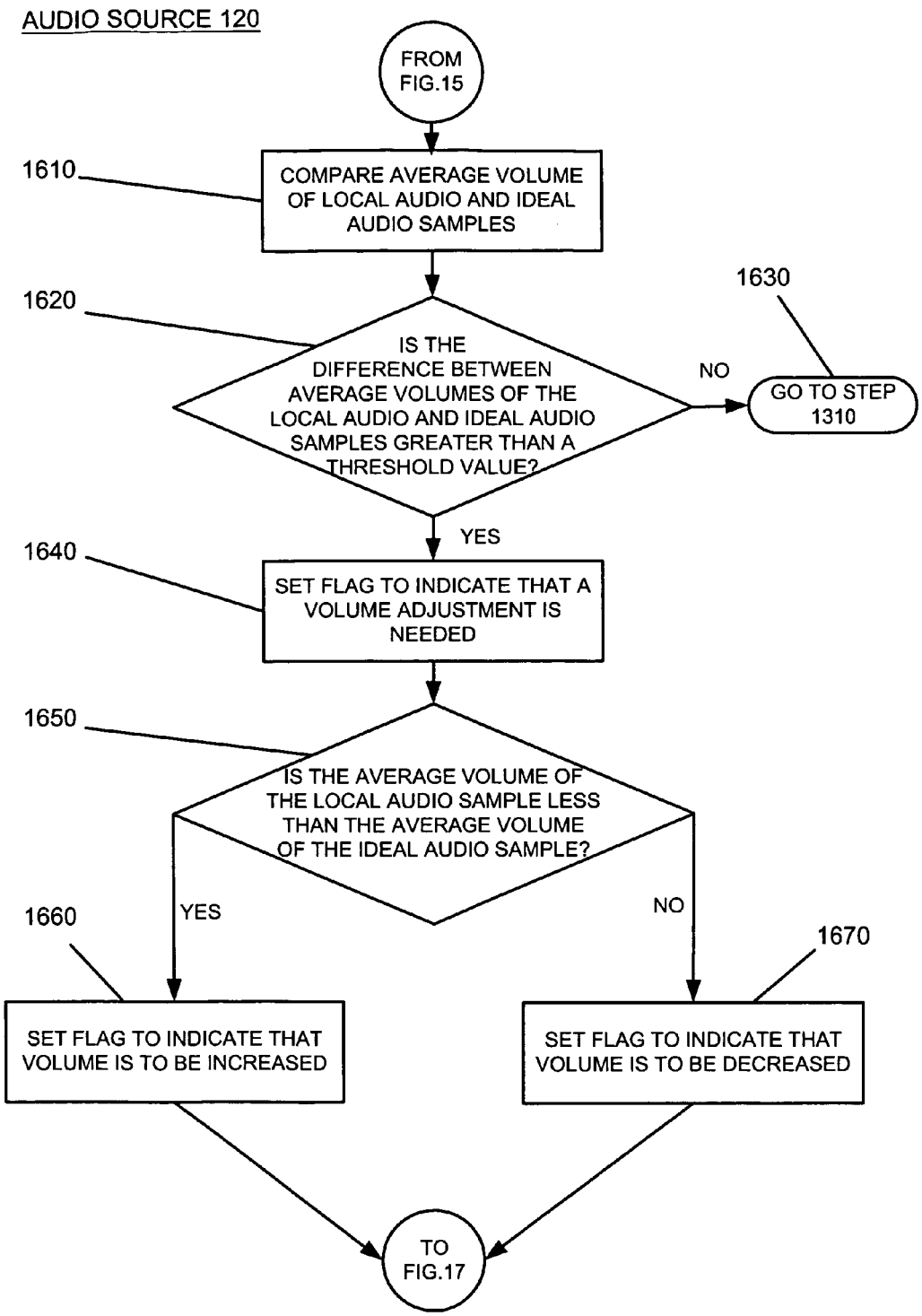

The audio source 120 may then compare the average volumes of the ideal audio sample and the local audio sample in a well-known manner [step 1610] (FIG. 16). FIG. 11, as described previously, illustrates an exemplary comparison operation consistent with the present invention. As illustrated, the audio source 120 determines an average volume level 1110 for the ideal audio sample. The audio source 120 also determines an average volume level 1120 for the local audio samples captured by local sensor 110 and transmitted to audio source 120 in data packet 1800. The audio source 120 may then compare the two average volumes to each other to arrive at a delta volume 1130 as illustrated by the difference between the dashed lines in FIG. 11. The delta volume may represent the average difference between the ideal audio sample and the local audio sample.

Audio source 120 may then determine if the average difference between the ideal audio sample and the local audio sample (i.e., the delta volume 1130) is greater than a threshold value [step 1620]. The threshold value may represent a value, below which it is determined that the two audio samples are close enough such that no volume adjustments are necessary. This threshold value may be set, for example, by the user or manufacturer of audio source 120.

If the audio source 120 determines that the average difference between the local audio samples and the ideal audio samples is below the threshold value, then no immediate volume adjustment is necessary and audio source 120 may return to step 1310 [step 1630]. If the average difference between the local audio samples and the ideal audio samples is greater than the threshold value, audio source 120 may set a flag or indicator that a volume adjustment at audio source 120 is warranted [step 1640]. The audio source 120 may store this flag in memory 315 until needed.

Audio source 120 may then determine if the average volume of the local audio signal is less than the average volume of the ideal audio sample [step 1650]. This may be determined, for example, by subtracting one average volume from the other. If the average volume of the local audio sample is less than the average volume of the ideal audio sample, then audio source 120 may set a flag to indicate that a volume increase is warranted [step 1660]. If the average volume of the local audio sample is greater than the average volume of the ideal audio sample, then audio source 120 may set a flag to indicate that a volume decrease is warranted [step 1670].

Figure 17:
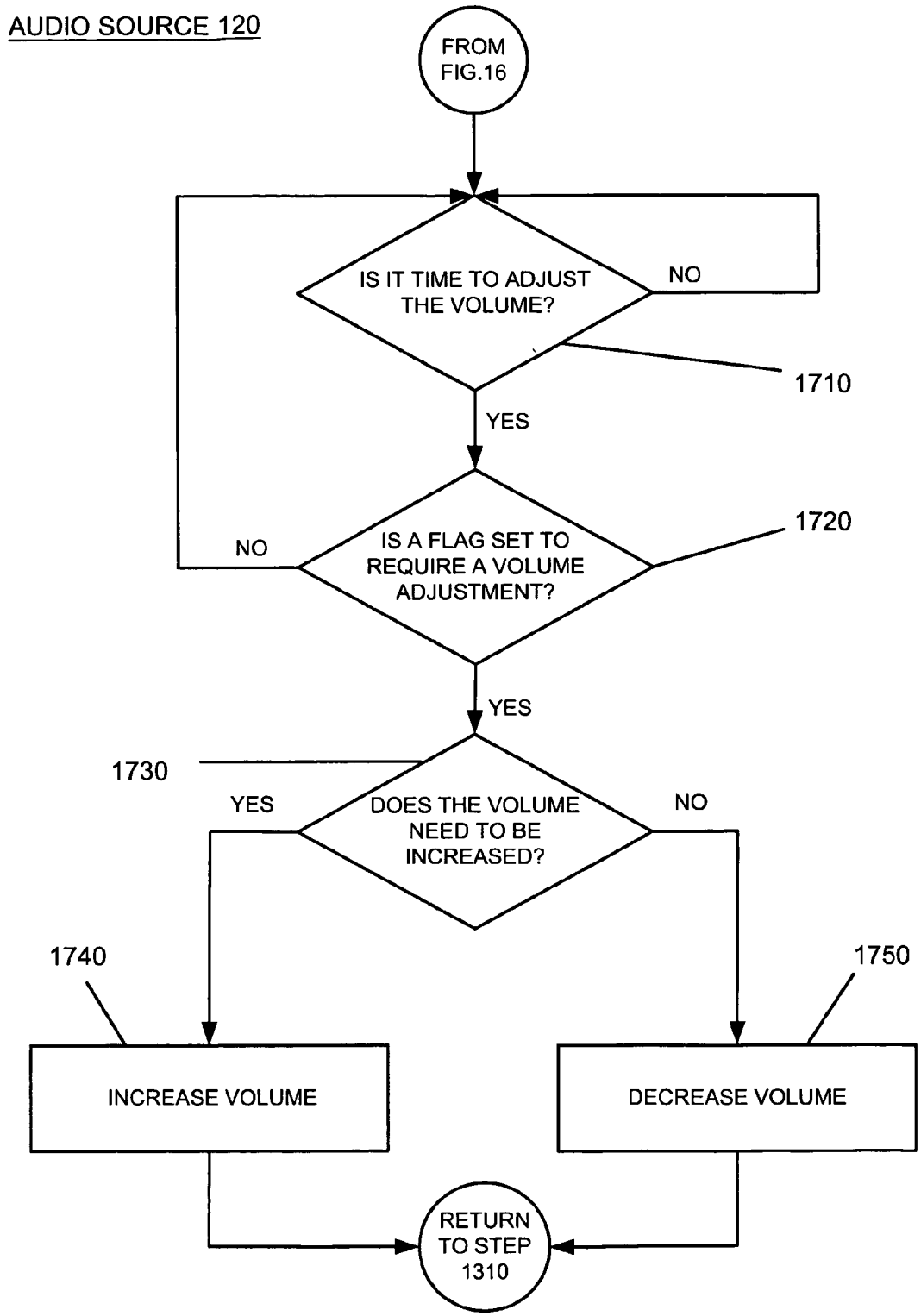

Once audio source 120 determines that a volume adjustment is necessary, the audio source 120 may then determine if it is time to adjust its volume [step 1710] (FIG. 17). The audio source 120 may query memory 315 to obtain the reactivity setting stored there. The audio source 120 may then determine how long it has been since the last volume adjustment was made, and based on that time, along with the reactivity setting, may determine if it is time to make another volume adjustment. If a predetermined amount of time has not elapsed since the last volume adjustment, audio source 120 may delay any future adjustments until the appropriate time. If the delay since the last volume adjustment is consistent with the value of the reactivity setting, then audio source 120 may determine if a flag is set indicating that either an increase or decrease in the volume is warranted [step 1720]. If a flag is not set, indicating that no volume adjustment is necessary, then audio source 120 may wait until the end of the next time period before looking again for the flag indicating whether an adjustment is necessary.

If a flag is set indicating that a volume adjustment is necessary, then audio source 120 may then determine whether the volume needs to be increased [step 1730]. Audio source 120 may, for example, query memory 315 to determine if a flag is set to indicate that an increase in volume is warranted. If audio source 120 determines that an increase in volume is warranted, then audio source 120 may increase the volume incrementally [step 1740]. CPU 310 may increase the gain of amplifier 350 and hence the volume of audio output device 355 which may, for example, consist of one or more standard speakers.

If audio source 120 determines that a decrease in volume is warranted, then audio source 120 may decrease the volume incrementally [step 1750]. Audio source 120 may, for example, query memory 315 to determine if a flag is set to indicate that a decrease in volume is warranted. In this case, for example, CPU 310 may reduce the gain of amplifier 350, and hence the volume of audio output device 355.

CONCLUSION

Systems and methods, consistent with the present invention, provide a mechanism by which an audio source can maintain a constant perceived volume level at a local sensor. A local sensor in close proximity to a user provides feedback to the audio source to raise, lower, or maintain its volume level so as to maintain that perceived constant volume level at the local sensor.

The foregoing description of exemplary embodiments of the present invention provides illustration and description, but is not intended to be exhaustive or to limit the invention to the precise form disclosed. Modifications and variations are possible in light of the above teachings or may be acquired from practice of the invention. For example, while the above-described processing is directed to adjusting the volume of audio signals, it will be appreciated that the present invention is equally applicable to adjusting sub-bands of an audio signal. In such an implementation, the local sensor may sample audio signals from each of a plurality of sub-bands. The local sensor may then instruct the audio source whether an adjustment of any or all of the sub-bands is necessary. This would allow, for example, local sensor to boost the bass of the audio source, while keeping the treble constant.

While series of steps have been described with regard to FIGS. 4–9 and 13–17, the order of the steps may be varied in other implementations consistent with the present invention. No element, step, or instruction used in the description of the present application should be construed as critical or essential to the invention unless explicitly described as such.

The scope of the invention is defined by the claims and their equivalents.

What is claimed is:

1. A method for adjusting an audio volume of an audio device, comprising:

receiving a first audio signal from the audio device at a location physically separate from the audio device;

receiving a data packet from the audio device at said location, the data packet comprising a second audio signal that is sampled at the audio device;

determining whether a difference between the first audio signal and the second audio signal exceeds a threshold value; and adjusting the audio volume of the audio device when the difference between the first audio signal and the second audio signal exceeds the threshold value.

2. The method of claim 1 wherein the data packet further comprises a volume level value, and wherein the determining includes:

determining an average volume level of the first audio signal, determining an average volume level of the second audio signal, multiplying the average volume level of the second audio signal with the volume level value to produce an adjusted average volume level, comparing the average volume level of the first audio signal to the adjusted average volume level, and determining whether a difference between the average volume level of the first audio signal and the adjusted average volume level exceeds the threshold value.

3. The method of claim 1 wherein the determining includes:

determining whether the audio volume is to be increased or decreased.

4. The method of claim 1 wherein the adjusting includes:

generating a data packet comprising a volume adjustment command, the volume adjustment command including a flag indicating that the audio volume is to be increased or decreased, transmitting the data packet containing the volume adjustment command to the audio device, and adjusting the audio volume based on the flag.

5. The method of claim 1 wherein the data packet further includes a reactivity setting value, and wherein the adjusting occurs when a time period since a previous audio volume adjustment equals or exceeds the reactivity setting value.

6. The method of claim 1 wherein the threshold value is set by a user.

7. The method of claim 1 further comprising:

determining, based on the determining whether a difference between the first audio signal and the second audio signal exceeds the threshold value, an amount to adjust the audio volume of the audio device, and wherein the adjusting includes:

adjusting the audio volume based on the amount.

8. A system for adjusting an audio volume of an audio device, comprising:

means for receiving at least one first audio signal from the audio device at a location physically separated from the audio device;

means for receiving a data packet from the audio device at said location, the data packet comprising at least one second audio signal that is sampled at the audio device;

means for determining whether a difference between the at least one first audio signal and the at least one second audio signal exceeds a threshold value; and means for adjusting the audio volume of the audio device when the difference between the at least one first audio signal and the at least one second audio signal exceeds the threshold value.

9. A system for adjusting audio volume, comprising:

a sensor configured to:

receive a first audio signal, receive at least one data packet comprising a second audio signal that is sampled at an audio device, said audio device being physically separated from said sensor, determine whether a difference between an average volume level of the first audio signal and the second audio signal exceeds a threshold value, generate a response data packet when the difference between the average volume level of the first audio signal and the second audio signal exceeds the threshold value, the response data packet including a volume adjustment command, and transmit the response data packet; and the audio device configured to:

transmit the first audio signal, transmit the at least one data packet to the sensor, receive the response data packet, and adjust an audio volume based on the response data packet.

10. The system of claim 9 wherein the at least one data packet includes a volume setting value, and wherein, when determining, the sensor is configured to:

multiply the average volume level of the second audio signal by the volume setting value to produce an adjusted average volume level, and compare the average volume level of the first audio signal with the adjusted average volume level.

11. The system of claim 9 wherein the sensor is further configured to:

determine whether the audio volume of the audio device is to be increased or decreased.

12. The system of claim 11 wherein the response data packet further includes a flag indicating that the audio volume of the audio device is to be increased or decreased, and wherein the audio device is configured to adjust the audio volume based on the flag.

13. The system of claim 9 wherein the at least one data packet includes a reactivity setting value, and wherein the sensor generates the response data packet when a time period since a previous transmission of a response packet equals or exceeds the reactivity setting value.

14. The system of claim 9 wherein the sensor is further configured to:

determine an amount of audio volume adjustment, and store the amount in the response data packet.

15. A computer-readable medium containing instructions for controlling at least one processor to perform a method for determining whether to adjust a volume of a remote audio device, the method comprising:

receiving at least one first audio signal from the remote audio device;

receiving a data packet comprising at least one second audio signal that is sampled at the remote audio device;

determining a difference between the at least one first audio signal and the at least one second audio signal;

comparing the difference to a threshold value;

generating a volume adjustment command when the difference exceeds the threshold value; and transmitting the volume adjustment command to the remote audio device.

16. A computer-readable medium containing instructions for controlling at least one processor to perform a method for adjusting a volume level, the method comprising:

transmitting at least one first audio signal from a source;

generating a data packet, the data packet comprising at least one second audio signal that is sampled at the source of the first audio signal;

transmitting the data packet to a remote device;

receiving a volume adjustment command from the remote device, the volume adjustment command comprising a flag indicating that the volume level is to be increased or decreased; and adjusting the volume level at the source in response to the flag.

17. A method for adjusting an audio level of an audio device, comprising:

receiving a first audio signal at a remote sensing device;

transmitting the received first audio signal to the audio device from the remote sensing device;

multiplying, at the audio device, a second audio signal by a volume setting value to produce an adjusted second audio signal;

determining, at the audio device, a difference between the first audio signal and the adjusted second audio signal;

comparing the difference to a threshold value; and adjusting the audio level of the audio device when the difference exceeds the threshold value.

18. The method of claim 17 wherein the determining includes:

determining whether the audio level is to be increased or decreased.

19. A system for adjusting an audio level, comprising:

a sensor configured to:
  receive at least one first audio signal,
  generate a data packet, the data packet comprising the at least one first audio signal, and
  transmit the data packet; and an audio device configured to:
  receive the data packet,
  retrieve at least one second audio signal,
  determine average volume levels of the at least one first audio signal and the at least one second audio signal,
  multiply the average volume level of the at least one second audio signal with a volume setting value to produce an adjusted average volume level,
  compare a difference between the average volume level of the first audio signal and the adjusted average volume level to a threshold value, and
  adjust the audio level when the difference exceeds the threshold value.

20. A computer-readable medium containing instructions for controlling at least one processor to perform a method for adjusting an audio level, the method comprising:

receiving a data packet from a remote device, the data packet comprising a first audio signal captured by the remote device;

determining an average volume level of the first audio signal;

determining an average volume level of a second audio signal;

multiplying the average volume level of the second audio signal by a volume setting value to produce an adjusted average volume level;

determining a difference between the average volume of the first audio signal and the adjusted average volume level;

comparing the difference to a threshold value; and adjusting the audio level when the difference exceeds the threshold value.

21. A method for adjusting an audio volume of an audio device, comprising:

receiving a first audio signal from the audio device at a location physically separated from the audio device, the first audio signal comprising a plurality of sub-bands;

receiving a data packet at the location, the data packet comprising a second audio signal comprising a plurality of sub-bands that are sampled at the audio device;

determining, for each sub-band, whether a difference between a sub-band of the first audio signal and a corresponding sub-band of the second audio signal exceeds a threshold value; and adjusting the audio volume of a sub-band at the audio device when the difference between a sub-band of the first audio source and the corresponding sub-band of the second audio signal exceeds the threshold value.

* * * * *